United States Patent
Itokawa et al.

(10) Patent No.: US 7,456,456 B2
(45) Date of Patent: Nov. 25, 2008

(54) SEMICONDUCTOR DEVICE AND METHOD OF MANUFACTURING THE SAME

(75) Inventors: Hiroshi Itokawa, Yokohama (JP); Koji Yamakawa, Tokyo (JP); Rainer Bruchhaus, Munich (DE)

(73) Assignees: Kabushiki Kaisha Toshiba, Tokyo (JP); Infineon Technologies AG, Munich (DE)

( * ) Notice: Subject to any disclaimer, the term of this patent is extended or adjusted under 35 U.S.C. 154(b) by 119 days.

(21) Appl. No.: 11/616,680

(22) Filed: Dec. 27, 2006

(65) Prior Publication Data
US 2007/0111334 A1   May 17, 2007

Related U.S. Application Data

(63) Continuation of application No. 10/882,203, filed on Jul. 2, 2004, now abandoned.

(51) Int. Cl.
*H01L 29/94* (2006.01)
(52) U.S. Cl. ........................ 257/295; 257/306; 257/310; 257/E27.104

(58) Field of Classification Search ................ 257/295, 257/306, 310, E27.104
See application file for complete search history.

(56) References Cited

U.S. PATENT DOCUMENTS 6,586,790 B2 *   7/2003   Kanaya et al. ............... 257/295

FOREIGN PATENT DOCUMENTS

| JP | 2000-260954 | 9/2000 |
| JP | 2001-196547 | 7/2001 |
| JP | 2003-174146 | 6/2003 |

* cited by examiner

*Primary Examiner*—Minh-Loan T Tran
(74) *Attorney, Agent, or Firm*—Oblon, Spivak, McClelland, Maier & Neustadt, P.C.

(57) ABSTRACT

A semiconductor device according to the present invention comprises a semiconductor substrate, a capacitor including a lower electrode disposed above the semiconductor substrate, a dielectric film disposed above the lower electrode, and an upper electrode disposed above the dielectric film, the upper electrode including metal oxide formed of $ABO_3$ perovskite oxide and containing at least an Ru element as a B site element, and a metal film containing a Ti element being disposed between the dielectric film and the upper electrode.

4 Claims, 5 Drawing Sheets

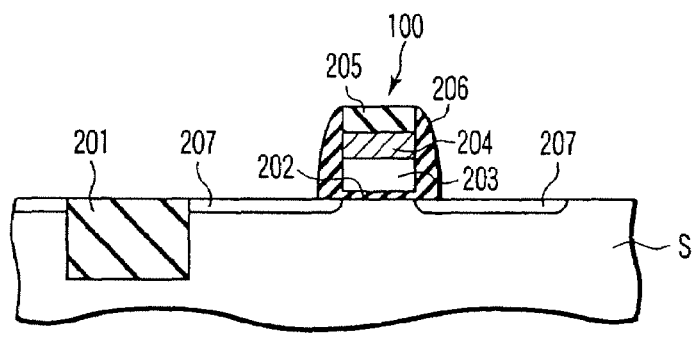
F I G. 2A
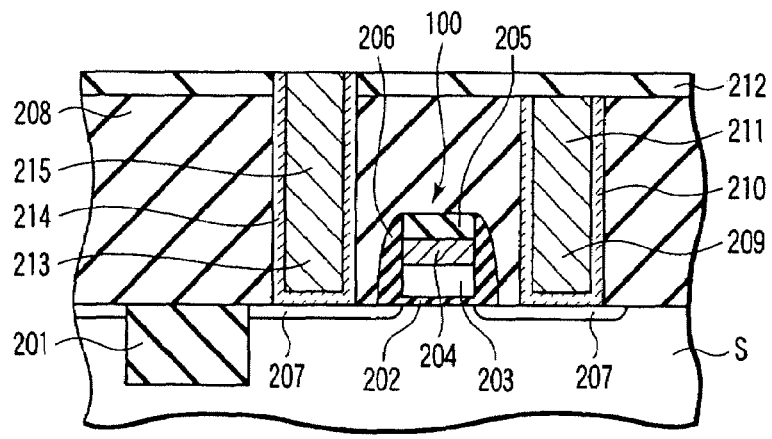
F I G. 2B
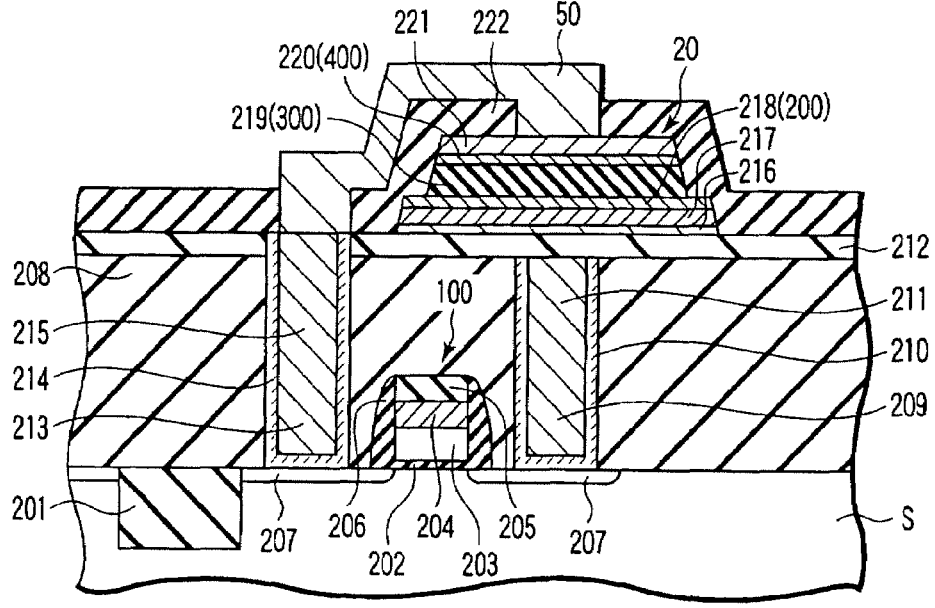
F I G. 2C

SEMICONDUCTOR DEVICE AND METHOD OF MANUFACTURING THE SAME

CROSS-REFERENCE TO RELATED APPLICATIONS

This application is a continuation of and claims the benefit of priority under 35 USC § 120 from U.S. Ser. No. 10/882,203 filed Jul. 2, 2004, the entire contents of which is incorporated herein by reference.

BACKGROUND OF THE INVENTION

1. Field of the Invention

The present invention relates to a semiconductor device and a method of manufacturing the device, more specifically, to a semiconductor device including a capacitor using a dielectric film, and a method of manufacturing the device.

2. Description of the Related Art

In recent years, development of a ferroelectric random access memory (FeRAM), which is a nonvolatile memory using a ferroelectric thin film, has been advanced.

For the FeRAM, ferroelectric materials such as PZT (Pb($Zr_xTi_{1-x}$)$O_3$), BIT($Bi_4Ti_3O_{12}$), and SBT($SrBi_2Ta_2O_9$) are used in a capacitor. All of these materials have a crystalline structure on the basis of a perovskite structure, whose basic structure is an oxygen octahedron. Different from a conventional Si oxide film, these materials do not have characteristic ferroelectricity in an amorphous state, and cannot therefore be used in amorphous. Therefore, processes for crystallization, such as a crystallizing heat treatment at a high temperature, and an in-situ crystallization process at the high temperature are required. In general, the temperature required for the crystallization is in a range of at least 400 to 700° C., depending on the material. Examples of a film forming method include an MOCVD process, a sputtering process, and a chemical solution deposition (CSD) process.

Moreover, a method of manufacturing a semi-conductor device using such ferroelectric thin film has been disclosed in Jpn. Pat. Appln. KOKAI Publication No. 2000-260954.

The FeRAM using PZT which is a Pb compound as a typical ferroelectric material as described above essentially contains wear-out factors, and is therefore requested to include a conductive oxide material as an electrode. As the conductive oxide material, conductive perovskite oxide films such as an $SrRuO_3$ film are used which have a satisfactory interface matching property with the perovskite oxide materials such as PZT.

However, when $SrRuO_3$ containing an Ru element is employed to an electrode film, excess Pb reacts with Ru at a film interface between PZT and $SrRuO_3$ and at a PZT grain boundary to form a conductive material ($Pb_2Ru_2O_{7-x}$, and the like), which act as a leak path, and an increase of a leak current caused by the path leads to a characteristics deterioration problem.

SUMMARY OF THE INVENTION

According to an aspect of the invention, there is provided a semiconductor device comprising: a semiconductor substrate; a capacitor including a lower electrode disposed above the semiconductor substrate, a dielectric film disposed above the lower electrode, and an upper electrode disposed above the dielectric film; the upper electrode including metal oxide formed of $ABO_3$ perovskite oxide and containing at least an Ru element as a B site element; and a metal film containing a Ti element being disposed between the dielectric film and the upper electrode.

According to another aspect of the invention, there is provided a semiconductor device comprising: a semiconductor substrate; and a capacitor including a lower electrode disposed above the semiconductor substrate, a dielectric film disposed above the lower electrode, and an upper electrode disposed above the dielectric film; the upper electrode including metal oxide formed of $ABO_3$ perovskite oxide and containing at least an Ru element and a Ti element as B site elements.

According to another aspect of the invention, there is provided a method of manufacturing a semiconductor device, comprising: disposing a lower electrode disposed above a semiconductor substrate; disposing a dielectric film above the lower electrode; disposing a metal film containing a Ti element above the dielectric film; and disposing an upper electrode including metal oxide formed of $ABO_3$ perovskite oxide and containing at least an Ru element as a B site element above the metal film to form a capacitor.

According to another aspect of the invention, there is provided a method of manufacturing a semiconductor device, comprising: disposing a lower electrode above a semiconductor substrate; disposing a dielectric film above the lower electrode; and disposing an upper electrode including metal oxide formed of $ABO_3$ perovskite oxide and containing at least an Ru element and a Ti element as B site elements above the dielectric film to form a capacitor.

BRIEF DESCRIPTION OF DRAWINGS

FIG. 2A is a sectional view showing the process of manufacturing the FeRAM according to a second embodiment;

FIG. 2B is a sectional view showing the process of manufacturing the FeRAM according to the second embodiment;

FIG. 2C is a sectional view showing the process of manufacturing the FeRAM according to the second embodiment;

DETAILED DESCRIPTION OF THE INVENTION

Embodiments will hereinafter be described with reference to the drawings.

Figure 1A:
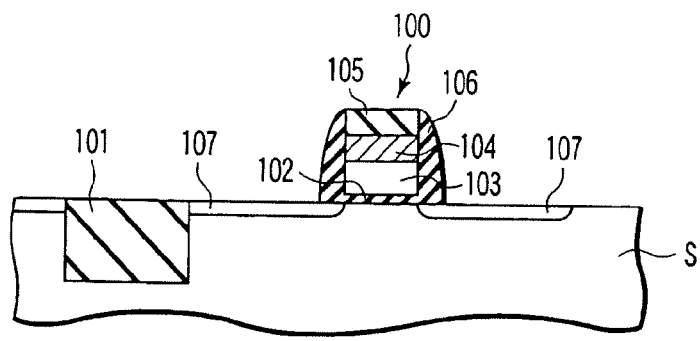
FIG. 1A is a sectional view showing a process of manufacturing an FeRAM according to a first embodiment.
Figure 1B:
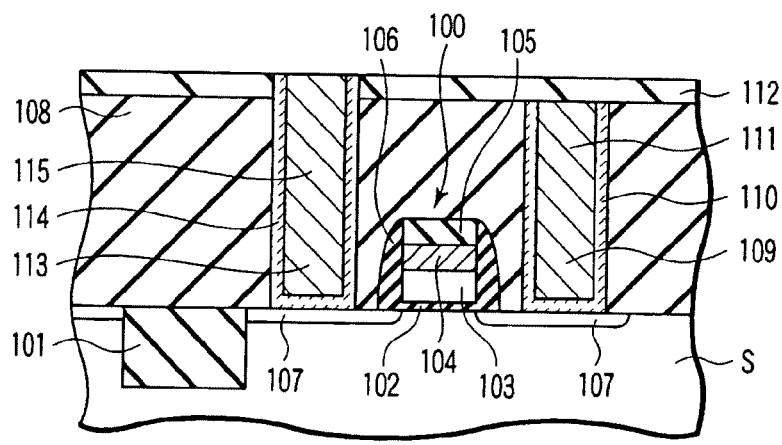
FIG. 1B is a sectional view showing the process of manufacturing the FeRAM according to the first embodiment.
Figure 1C:
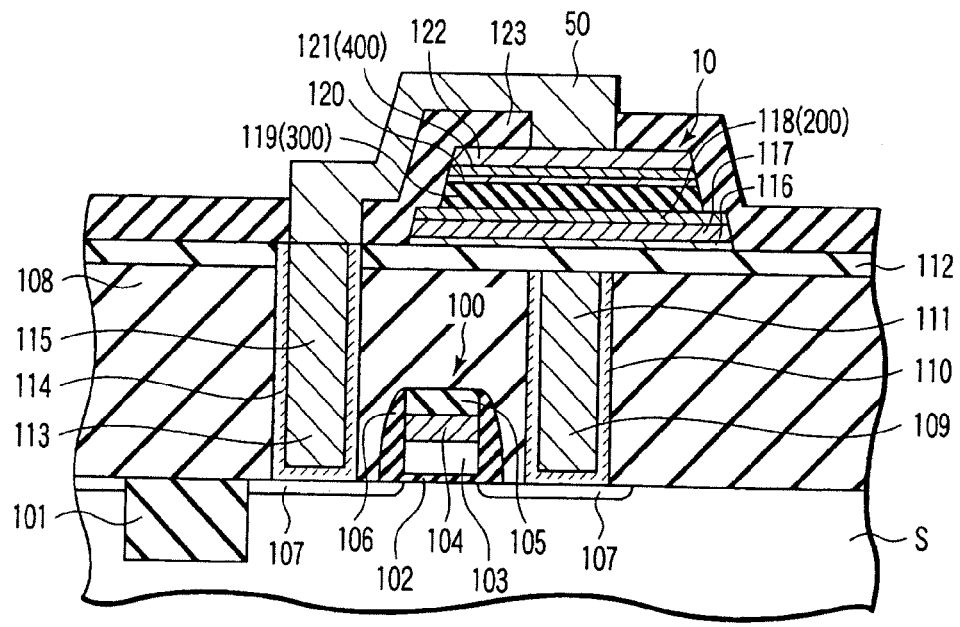
FIG. 1C is a sectional view showing the process of manufacturing the FeRAM according to the first embodiment.

FIGS. 1A, 1B, and 1C are sectional views showing a process of manufacturing an FeRAM according to a first embodiment. In the first embodiment, in a capacitor, a metal film containing titanium (Ti) having a film thickness of 2.5 nm is disposed between a ferroelectric film, which is a PZT (Pb $(Zr_xTi_{1-x})O_3$) film, and a metal oxide film constituting an upper electrode, which is an $SrRuO_3$ film. An example of application of this capacitor to an offset type FeRAM cell will hereinafter be described.

First, as shown in FIG. 1A, a trench for isolating devices is formed in a region other than a transistor active region of a surface of a P type Si substrate S, then an $SiO_2$ is buried in the trench to form an isolation 101 (shallow trench isolation). Subsequently, a transistor for operating switches is formed.

First, an oxide film 102 having a thickness of about 6 nm is formed on the entire surface of the Si substrate S by thermal oxidation, subsequently, an n+ type polycrystalline silicon film 103 doped with arsenic is formed on the entire surface of the oxide film 102, further a $WSi_x$ film 104 is formed on the polycrystalline silicon film 103, and a nitride film 105 is formed on the $WSi_x$ film 104. Thereafter, the polycrystalline silicon film 103, $WSi_x$ film 104, and nitride film 105 are processed by conventional photolithography and RIE processes to form a gate electrode 100.

Furthermore, a nitride film 106 is deposited, and a spacer is formed on a side wall of the gate electrode 100 leaving the side wall spacer by anisotropic RIE. Moreover, although details of the process are omitted from the description, sources/drains 107 are formed by ion implantations and heat treatments.

Next, as shown in FIG. 1B, a CVD oxide film 108 is deposited on the entire surface. Thereafter, the surface is once planarized by CMP, and a contact hole 109 connecting with one of the source/drain 107 of a transistor is formed. Thereafter, a thin titanium film is deposited by sputtering or CVD, and a heat treatment is performed in a forming gas to form a TiN film 110. Subsequently, a CVD tungsten 111 is deposited on the entire surface, the tungsten 111 is removed from a region other than the contact hole 109 by CMP process, so that the tungsten is buried in the contact hole 109.

Thereafter, a CVD nitride film 112 is deposited on the entire surface, a contact hole 113 connecting with the other source/drain 107 of the transistor is formed, another TiN film 114 is similarly formed, and a tungsten 115 is buried in the contact hole 113 to form a plug connecting with a capacitor.

Thereafter, as shown in FIG. 1C, a titanium film 116 having a thickness of 10 nm is deposited on the entire surface of the CVD nitride film 112 by sputtering, and subsequently a platinum film 117 having a thickness of about 100 nm is deposited on the entire surface of the titanium film 116 by sputtering. Thereafter, a first $SrRuO_3$ film 118 serving as a lower electrode 200 of the capacitor and having a thickness of 10 nm is deposited on the entire surface of the platinum film 117 by sputtering, and the first $SrRuO_3$ film 118 is once crystallized by rapid thermal anneal (RTA) in oxygen. In this case, when the first $SrRuO_3$ film 118 is deposited, for example, at a temperature of 550° C., it is possible to easily form a crystalline $SrRuO_3$ film having a satisfactory quality.

Furthermore, a PZT film 119 serving as a capacitor dielectric film 300 is formed on the first $SrRuO_3$ film 118 by sputtering, and the PZT film 119 is once crystallized by rapid thermal anneal (RTA) in oxygen. Thereafter, a titanium film 120 having a thickness of 2.5 nm is deposited on the PZT film 119 by sputtering, and a second $SrRuO_3$ film ($ABO_3$ perovskite oxide film) 121 serving as an upper electrode 400 of the capacitor and having a thickness of 10 nm is deposited on the titanium film 120, and the second $SrRuO_3$ film 121 is once crystallized in oxygen by rapid thermal anneal (RTA). In this case, when the second $SrRuO_3$ film 121 is deposited, for example, at a temperature of 550° C., it is possible to easily form the $SrRuO_3$ film having a satisfactory quality. Thereafter, a platinum film 122 is formed on the second $SrRuO_3$ film 121 by sputtering.

Subsequently, once a CVD oxide film is deposited as a processing mask material, the CVD oxide film is patterned by photolithography and RIE processes. After a photo resist is removed, the platinum film 122, second $SrRuO_3$ film 121, titanium film 120, and PZT film 119 are etched by RIE (processes). Furthermore, the first $SrRuO_3$ film 118, platinum film 117, and titanium film 116 are patterned in order by a combination of the photolithography and RIE (processes) to complete the forming of a capacitor 10. The capacitor 10 has a nonvolatile memory function. Thereafter, a CVD oxide film 123 is deposited all over the surface of the capacitor 10 to cover the capacitor 10, and a heat treatment is performed in oxygen at about 650° C. in order to recover damage in the PZT film 119 generated during the processing.

Thereafter, although the details are omitted, a drive line and a bit line are formed, further, a wiring 50 is formed to connect a contact connecting with the other source/drain 107 of the transistor and the platinum film 122, then an upper-layer metal wiring is formed. Through this process, the FeRAM is completed.

It is to be noted that a $BaRuO_3$ film may also be used instead of the second $SrRuO_3$ film 121. Moreover, the titanium film 120 may also be formed by a CVD process or a sol-gel process instead of the sputtering process.

As described above, in the capacitor of FeRAM of the first embodiment, a metal film containing Ti is disposed between the upper electrode including metal oxide containing Ru and the PZT film. This prevents reaction of excess Pb with Ru at a film interface between the PZT film and the upper electrode and at a PZT grain boundary, so that leak current is reduced.

FIGS. 2A, 2B, and 2C are sectional views showing a process of manufacturing an FeRAM according to a second embodiment. In the second embodiment, in a capacitor, an $SrRuO_3$ film as a metal oxide constituting an upper electrode is doped with titanium to form an $Sr(Ru, Ti)O_3$ film having a thickness of 10 nm. Another example of the application of this capacitor to the offset type FeRAM cell will hereinafter be described. It is to be noted that remaining structure is similar to that of the first embodiment.

First, as shown in FIG. 2A, a trench for isolating the devices is formed in a region other than a transistor active region of a surface of a P type Si substrate S, then an $SiO_2$ is buried in the trench to form an isolation 201 (shallow trench isolation). Subsequently, a transistor for operating switches is formed.

First, an oxide film 202 having a thickness of about 6 nm is formed on the entire surface of the Si substrate S by thermal oxidation, subsequently, an n+ type polycrystalline silicon film 203 doped with arsenic is formed on the entire surface of the oxide film 202, further a $WSi_x$ film 204 is formed on the polycrystalline silicon film 203, and a nitride film 205 is formed on the $WSi_x$ film 204. Thereafter, the polycrystalline silicon film 203, $WSi_x$ film 204, and nitride film 205 are processed by conventional photolithography and RIE processes to form a gate electrode 100.

Furthermore, a nitride film 206 is deposited, and a spacer is formed on the side wall of the gate electrode 100 leaving the side wall spacer by anisotropic RIE. Moreover, although the details of the process are omitted from the description, sources/drains 207 are formed by ion implantations and heat treatments.

Next, as shown in FIG. 2B, a CVD oxide film 208 is deposited on the entire surface. Thereafter, the surface is once planarized by CMP, and a contact hole 209 connecting with one of the source/drain 207 of a transistor is formed. Thereafter, a thin titanium film is deposited by sputtering or CVD, and a heat treatment is performed in a forming gas to form a TiN film 210. Subsequently, a CVD tungsten 211 is deposited on the entire surface, the tungsten 211 is removed from the region other than the contact hole 209 by CMP, so that the tungsten is buried in the contact hole 209.

Thereafter, a CVD nitride film 212 is deposited on the entire surface, a contact hole 213 connecting with the other source/drain 207 of the transistor is formed, another TiN film 214 is similarly formed, and a tungsten 215 is buried in the contact hole 213 to form a plug connecting with a capacitor.

Thereafter, as shown in FIG. 2C, a titanium film 216 having a thickness of 10 nm is deposited on the entire surface of the CVD nitride film 212 by sputtering, and subsequently a platinum film 217 having a thickness of about 100 nm is deposited on the entire surface of the titanium film 216 by sputtering. Thereafter, an $SrRuO_3$ film 218 serving as a lower electrode 200 of the capacitor and having a thickness of 10 nm is deposited on the entire surface of the platinum film 217 by sputtering, and the $SrRuO_3$ film 218 is once crystallized by rapid thermal anneal (RTA) in oxygen. In this case, when the $SrRuO_3$ film 218 is deposited, for example, at a temperature of 550° C., it is possible to easily form the crystalline $SrRuO_3$ film having the satisfactory quality.

Furthermore, a PZT film 219 serving as a capacitor dielectric film 300 is formed on the $SrRuO_3$ film 218 by sputtering, and the PZT film 219 is once crystallized by rapid thermal anneal (RTA) in oxygen. Thereafter, an $Sr(Ru, Ti)O_3$ film ($ABO_3$ perovskite oxide film) 220 serving as an upper electrode 400 of the capacitor and having a thickness of 10 nm is deposited on the PZT film 219 by sputtering, and the $Sr(Ru, Ti)O_3$ film 220 is once crystallized in oxygen by rapid thermal anneal (RTA). It is to be noted that the $Sr(Ru, Ti)O_3$ film 220 is a film obtained by doping the $SrRuO_3$ film with titanium, and the content of Ti in $Sr(Ru, Ti)O_3$ is less than 50%. In this case, when the $Sr(Ru, Ti)O_3$ film 220 is deposited, for example, at a temperature of 550° C., it is possible to easily form the $Sr(Ru, Ti)O_3$ film having a satisfactory quality. Thereafter, a platinum film 221 is formed on the $Sr(Ru, Ti)O_3$ film 220 by sputtering.

Subsequently, once a CVD oxide film is deposited as a processing mask material, the CVD oxide film is patterned by the photolithography and RIE processes. After a photo resist is removed, the platinum film 221, $Sr(Ru, Ti)O_3$ film 220, and PZT film 219 are etched by RIE (processes). Furthermore, the $SrRuO_3$ film 218, platinum film 217, and titanium film 216 are patterned in order by the combination of the photolithography and RIE (processes) to complete the forming of a capacitor 20. The capacitor 20 has the nonvolatile memory function. Thereafter, a CVD oxide film 222 is deposited on the entire surface of the capacitor 20 to cover the capacitor 20, then a heat treatment is performed in oxygen at about 650° C. in order to recover the damage in the PZT film 219 generated during the processing.

Thereafter, although the details are omitted, a drive line and bit line are formed, further, the wiring 50 is formed to connect the contact connecting with the other source/drain 207 of the transistor and the platinum film 221, then an upper-layer metal wiring is formed. Through this process, the FeRAM is completed.

It is to be noted that the $Sr(Ru, Ti)O_3$ film 220 formed by doping $SrRuO_3$ with titanium is formed as the upper electrode of the capacitor, but the material is not limited to this, and a $Ba(Ru, Ti)O_3$ film, and the like may also be used.

As described above, in the capacitor of FeRAM of the second embodiment the upper electrode using metal oxide containing Ru and Ti is applied. This prevents a reaction of excess Pb with Ru at the film interface between the PZT film and the upper electrode and at the PZT grain boundary, and the leak current can be reduced.

Figure 3A:
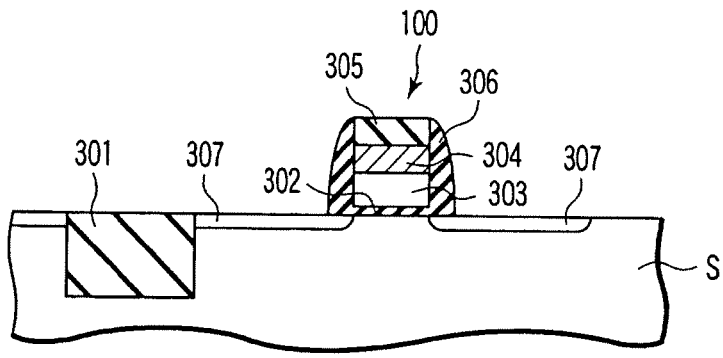
FIG. 3A is a sectional view showing the process of manufacturing the FeRAM according to a third embodiment.
Figure 3B:
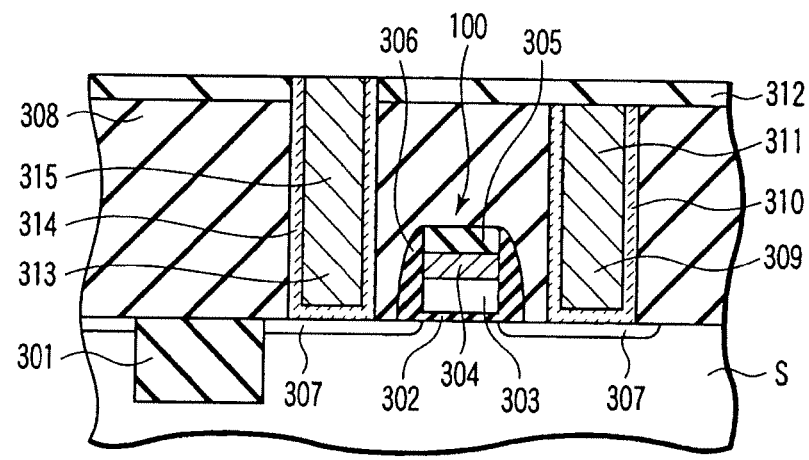
FIG. 3B is a sectional view showing the process of manufacturing the FeRAM according to the third embodiment.
Figure 3C:
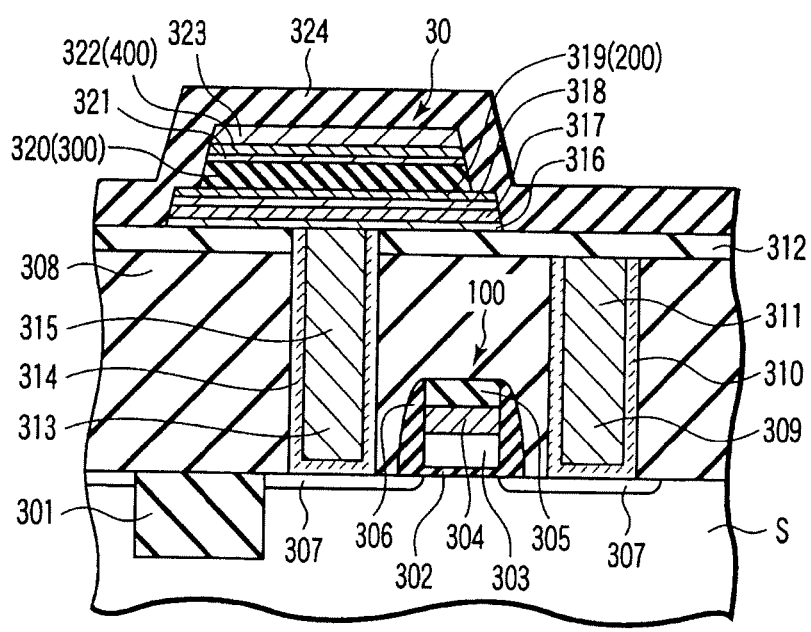
FIG. 3C is a sectional view showing the process of manufacturing the FeRAM according to the third embodiment.

FIGS. 3A, 3B, and 3C are sectional views showing the process of manufacturing an FeRAM according to a third embodiment. In the third embodiment, a tungsten is used in a plug material positioned under a capacitor, and a metal film containing titanium (Ti) having a film thickness of 2.5 nm is disposed between a PZT film which is a ferroelectric film and an $SrRuO_3$ film which is metal oxide constituting an upper electrode of the capacitor. An example of the application to a COP type FeRAM cell will hereinafter be described.

First, as shown in FIG. 3A, a trench for isolating the devices is formed in a region other than a transistor active region of the surface of a P type Si substrate S, then an $SiO_2$ is buried in the trench to form an isolation 301 (shallow trench isolation). Subsequently, a transistor for operating switches is formed.

First, an oxide film 302 having a thickness of about 6 nm is formed on the entire surface of the Si substrate S by thermal oxidation, subsequently, an n+ type polycrystalline silicon film 303 doped with arsenic is formed on the entire surface of the oxide film 102, further a $WSi_x$ film 304 is formed on the polycrystalline silicon film 303, and a nitride film 305 is formed on the $WSi_x$ film 304. Thereafter, the polycrystalline silicon film 303, $WSi_x$ film 304, and nitride film 305 are processed by conventional photolithography and RIE processes to form a gate electrode 100.

Furthermore, a nitride film 306 is deposited, and a spacer is formed on a side wall of the gate electrode 100 leaving the side wall spacer by anisotropic RIE. Moreover, although the details of the process are omitted from the description, sources/drains 307 are formed by ion implantations and heat treatments.

Next, as shown in FIG. 3B, after depositing a CVD oxide film 308 on the entire surface, the surface is once planarized by CMP, and a contact hole 309 connecting with one of the source/drain 307 of the transistor is formed. Thereafter, a thin titanium film is deposited by sputtering or CVD, and a heat treatment is performed in a forming gas to form a TiN film 310. Subsequently, a CVD tungsten 311 is deposited on the entire surface, the tungsten 311 is removed from the region other than the contact hole 309 by CMP, and the tungsten is buried in the contact hole 309.

Thereafter, a CVD nitride film 312 is deposited on the entire surface, a contact hole 313 connecting with the other source/drain 307 of the transistor is formed, another TiN film 314 is similarly formed, and a tungsten 315 is buried in the contact hole 313 to form a plug connecting with a capacitor.

Thereafter, as shown in FIG. 3C, a titanium film 316 having a thickness of 10 nm is deposited on the entire surface of the CVD nitride film 312 by sputtering, and subsequently an iridium film 317 having a thickness of about 100 nm is deposited on the entire surface of the titanium film 316 by sputtering. Thereafter, a platinum film 318 having a thickness of about 50 nm is deposited on the entire surface of the iridium film 317 by sputtering. Thereafter, a first $SrRuO_3$ film 319 forming a lower electrode 200 of the capacitor and having a thickness of 10 nm is deposited on the entire surface of the platinum film 318 by sputtering, and the first $SrRuO_3$ film 319 is once crystallized by rapid thermal anneal (RTA) in oxygen. In this case, when the first $SrRuO_3$ film 319 is deposited, for example, at a temperature of 550° C., it is possible to easily form the crystalline $SrRuO_3$ film having a satisfactory quality.

Furthermore, a PZT film 320 serving as a capacitor dielectric film 300 is formed on the first SrRuO$_3$ film 319 by sputtering, and the PZT film 320 is once crystallized by rapid thermal anneal (RTA) in oxygen Thereafter, a titanium film 321 having a thickness of 2.5 nm is deposited on the PZT film 320 by sputtering. Furthermore, a second SrRuO$_3$ film (ABO$_3$ perovskite oxide film) 322 serving as an upper electrode 400 of the capacitor and having a thickness of 10 nm is deposited on the titanium film 321 by sputtering, and the second SrRuO$_3$ film 322 is once crystallized in oxygen by rapid thermal anneal (RTA). In this case, when the second SrRuO$_3$ film 322 is deposited, for example, at a temperature of 550° C., it is possible to easily form the Sr(Ru, Ti)O$_3$ film having a satisfactory quality. Thereafter, a platinum film 323 is formed on the second SrRuO$_3$ film 322 by sputtering.

Subsequently, once a CVD oxide film is deposited as a processing mask material, the CVD oxide film is patterned by the photolithography and RIE processes. After a photo resist is removed, the platinum film 323, second SrRuO$_3$ film 322, titanium film 321, and PZT film 320 are etched by RIE. Furthermore, the first SrRuO$_3$ film 319, platinum film 318, iridium film 317, and titanium film 316 are patterned in order by the combination of the photolithography and RIE (processes) to complete the forming of a capacitor 30. The capacitor 30 has the nonvolatile memory function. Thereafter, a CVD oxide film 324 is deposited on the entire surface of the capacitor 30 to cover the capacitor 30, and a heat treatment is performed in oxygen at about 650° C. in order to recover the damage in the PZT film 320 generated during the processing. In this case, oxygen also penetrates to the capacitor 30 to contribute to recovery from the damage. On the other hand, a part of oxygen also reaches the lower electrode 200, but the iridium film 317 has an oxygen diffusion preventing effect, and therefore underlying tungsten 315 is not oxidized.

Thereafter, although the details are omitted, a drive line and bit line are formed, then an upper-layer metal wiring is formed. Through this process, the FeRAM is completed.

It is to be noted that in the third embodiment, the iridium film 317 is formed, but noble metal materials such as ruthenium and its oxide may also be used instead of iridium. Moreover, BaRuO$_3$, and the like may also be used instead of SrRuO$_3$ for the films 319, 322 having a film thickness of 10 nm. The titanium film 321 may also be formed by a CVD process or a sol-gel process instead of the sputtering process.

As described above, in the capacitor of FeRAM of the third embodiment, the metal film containing Ti is disposed between the upper electrode using metal oxide containing Ru and the PZT film. This prevents the reaction of excess Pb with Ru at the film interface between the PZT film and the upper electrode and at the PZT grain boundary, so that the leak current can be reduced.

Figure 4A:
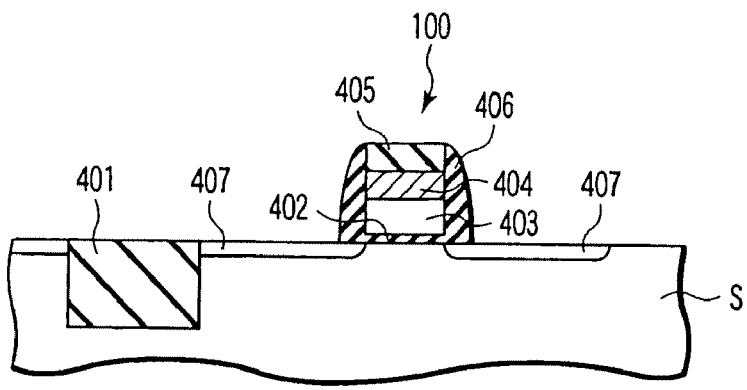
FIG. 4A is a sectional view showing the process of manufacturing the FeRAM according to a fourth embodiment.
Figure 4B:
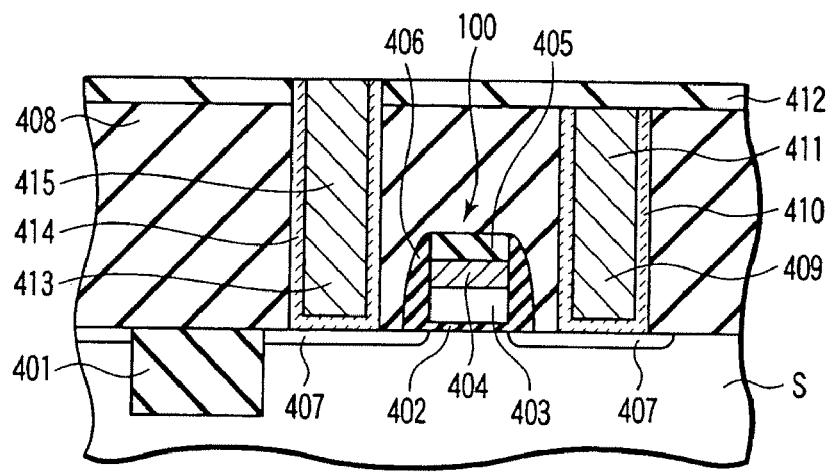
FIG. 4B is a sectional view showing the process of manufacturing the FeRAM according to the fourth embodiment.
Figure 4C:
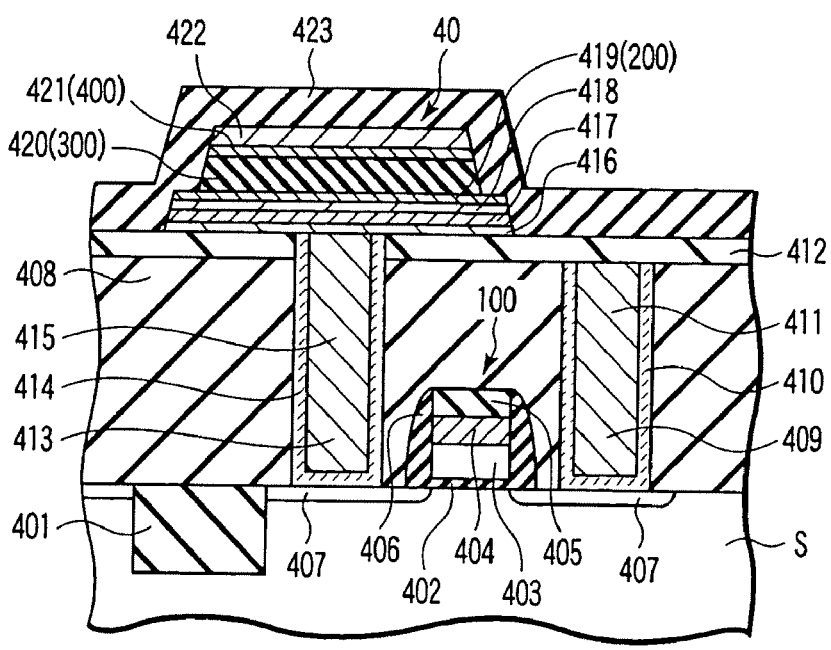
FIG. 4C is a sectional view showing the process of manufacturing the FeRAM according to the fourth embodiment.

FIGS. 4A, 4B, and 4C are sectional views showing the process of manufacturing an FeRAM according to a fourth embodiment. In the fourth embodiment, a tungsten is used in a plug material positioned under a capacitor, and an SrRuO$_3$ film serving as an upper electrode of the capacitor and formed of metal oxide is doped with titanium to form an Sr(Ru, Ti)O$_3$ film having a film thickness of 10 nm. Another example of the application to the COP type FeRAM cell will hereinafter be described. It is to be noted that the remaining structure is similar to that of the third embodiment.

First, as shown in FIG. 4A, a trench for isolating devices is formed in a region other than a transistor active region of the surface of a P type Si substrate S, and an SiO$_2$ is buried in the trench to form an isolation 401 (shallow trench isolation). Subsequently, a transistor for operating switches is formed.

First, an oxide film 402 having a thickness of about 6 nm is formed on the entire surface of the Si substrate S by a thermal oxidation, subsequently, an n+ type polycrystalline silicon film 403 doped with arsenic is formed on the entire surface of the oxide film 402, further a WSi$_x$ film 404 is formed on the polycrystalline silicon film 403, and a nitride film 405 is formed on the WSi$_x$ film 404. Thereafter, the polycrystalline silicon film 403, WSi$_x$ film 404, and nitride film 405 are processed by conventional photolithography and RIE processes to form a gate electrode 100.

Furthermore, a nitride film 406 is deposited, and a spacer is formed on a side wall of the gate electrode 100 leaving the side wall spacer by anisotropic RIE. Moreover, although the details of the process are omitted from the description, sources/drains 407 are formed by ion implantations and heat treatments.

Next, as shown in FIG. 4B, after depositing a CVD oxide film 408 on the entire surface, the surface is once planarized by CMP, and a contact hole 409 connecting with one of the source/drain 407 of the transistor is formed. Thereafter, a thin titanium film is deposited by sputtering or CVD, and a heat treatment is performed in a forming gas to form a TiN film 410. Subsequently, a CVD tungsten 411 is deposited on the entire surface, the tungsten 411 is removed from the region outside the contact hole 409 by CMP, and the tungsten is buried in the contact hole 409.

Thereafter, a CVD nitride film 412 is deposited on the entire surface, a contact hole 413 connecting with the other source/drain 407 of the transistor is formed, a TiN film 414 is similarly formed, and a tungsten 415 is buried in the contact hole 413 to form a plug connecting with the capacitor.

Thereafter, as shown in FIG. 4C, a titanium film 416 having a thickness of 10 nm is deposited on the entire surface of the CVD nitride film 412 by sputtering, and subsequently, an iridium film 417 having a thickness of about 100 nm is deposited on the entire surface of the titanium film 416 by sputtering. Thereafter, a platinum film 418 having a thickness of about 50 nm is deposited on the entire surface of the iridium film 417 by sputtering. Thereafter, an SrRuO$_3$ film 419 serving as a lower electrode 200 of the capacitor and having a thickness of 10 nm is deposited on the entire surface of the platinum film 418 by sputtering, and the SrRuO$_3$ film 419 is once crystallized by rapid thermal anneal (RTA) in oxygen. In this case, when the SrRuO$_3$ film 419 is deposited, for example, at a temperature of 550° C., it is possible to easily form the crystalline SrRuO$_3$ film having a satisfactory quality.

Furthermore, a PZT film 420 serving as a capacitor dielectric film 300 is formed on the SrRuO$_3$ film 419 by sputtering, and the PZT film 420 is once crystallized by rapid thermal anneal (RTA) in oxygen. Thereafter, an Sr(Ru, Ti)O$_3$ film (ABO$_3$ perovskite oxide film) 421 serving as an upper electrode 400 of the capacitor and having a thickness of 10 nm is deposited on the PZT film 420 by sputtering, and the Sr(Ru, Ti)O$_3$ film 421 is once crystallized in oxygen by rapid thermal anneal (RTA). It is to be noted that the Sr(Ru, Ti)O$_3$ film 421 is a film obtained by doping the SrRuO$_3$ film with titanium, and the content of Ti in Sr(Ru, Ti)O$_3$ is less than 50%. In this case, when the Sr(Ru, Ti)O$_3$ film 421 is deposited, for example, at a temperature of 550° C., it is possible to easily form the Sr(Ru, Ti)O$_3$ film having a satisfactory quality. Thereafter, a platinum film 422 is formed on the Sr(Ru, Ti)O$_3$ film 421 by sputtering.

Subsequently, once a CVD oxide film is deposited as a processing mask material, the CVD oxide film is patterned by photolithography and RIE processes. After a photo resist is removed, the platinum film 422, Sr(Ru, Ti)O$_3$ film 421, and PZT film 420 are etched by RIE (processes). Furthermore, the SrRuO$_3$ film 419, platinum film 418, iridium film 417, and titanium film 416 are patterned in order by a combination of photolithography and RIE (processes) to complete the forming of a capacitor 40. The capacitor 40 has the nonvolatile memory function. Thereafter, a CVD oxide film 423 is deposited on the entire surface of the capacitor 40 to cover the capacitor 40, and a thermal treatment is performed in oxygen at about 650° C. in order to recover a damage in the PZT film 420 generated during the processing. In this case, oxygen also penetrates to the capacitor 40 to contribute to the recovery from the damages. On the other hand, a part of oxygen also reaches the lower electrode 200, but the iridium film 417 then has an oxygen diffusion preventing effect, and therefore underlying tungsten 415 is not oxidized.

Thereafter, although the details are omitted, a drive line and bit line are formed, and an upper-layer metal wiring is formed. Through this process, the FeRAM is completed.

It is to be noted that in the fourth embodiment, the iridium film 417 is formed, but the noble metal materials such as ruthenium and its oxide may also be used instead of iridium. Moreover, Ba(Ru, Ti)O$_3$, and the like may also be used instead of Sr(Ru, Ti)O$_3$ for the film 421 having a film thickness of 10 nm.

As described above, in the capacitor of FeRAM of the fourth embodiment, the upper electrode including metal oxide containing Ru and Ti is applied. This prevents the reaction of excess Pb with Ru at the film interface between the PZT film and the upper electrode and at the PZT grain boundary, so that the leak current can be reduced.

Figure 5:
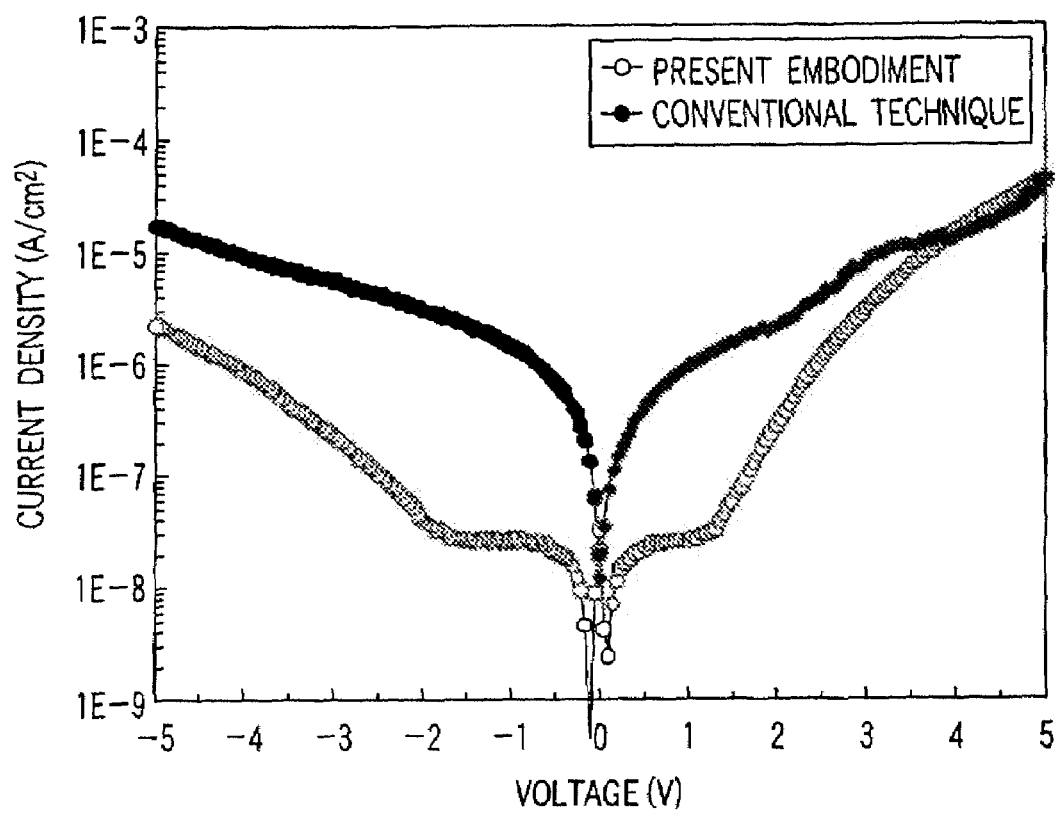
FIG. 5 is a diagram showing leak current characteristics of PZT capacitors formed by a manufacturing process of the embodiment and a conventional manufacturing process.

FIG. 5 is a diagram showing leak current characteristics of PZT capacitors formed by the manufacturing processes of the present embodiment and a conventional technique. In FIG. 5, the leak current characteristics offered by the present embodiments are shown by open circles, and those of the conventional technique are shown by solid circles.

For the PZT capacitor produced by the manufacturing process of the present embodiment, after forming a titanium film having a thickness of 10 nm on an SiO$_2$ film formed on an Si substrate, a 100 nm thick platinum film is formed, and further a 10 nm thick SrRuO$_3$ film is formed. Subsequently, a 140 nm thick PZT film, 2.5 nm to 5 nm (e.g., 2.5 nm) thick titanium film, 10 nm thick SrRuO$_3$ film, and 50 nm thick platinum film are successively deposited.

For the PZT capacitor produced by the manufacturing process of the related art, after forming a titanium film having a thickness of 10 nm on an SiO$_2$ film formed on an Si substrate, a 100 nm thick platinum film is formed, and further a 10 nm thick SrRuO$_3$ film is formed. Subsequently, a 140 nm thick PZT film, 10 nm thick SrRuO$_3$ film, and 50 nm thick platinum film are successively deposited.

In both the present embodiment and the conventional technique, for the SrRuO$_3$ film and the PZT film formation, amorphous films are formed by sputtering, and the films are annealed and accordingly crystallized in an oxygen atmosphere. As shown in FIG. 5, when the titanium film is applied at the interface between the PZT film and the upper SrRuO$_3$ film as in the present embodiment, the leak current can be reduced as compared with that in the conventional technique.

As described above, the capacitor of FeRAM produced by the present embodiment applies the metal film containing Ti, which is disposed between the upper electrode including the metal oxide containing Ru and the PZT film, or the upper electrode including the metal oxide containing Ru and Ti is applied. In this structure containing Ti, excess Pb is prevented from reacting with Ru at the film interface between the PZT film and the upper electrode and at the PZT grain boundary, thus the leak current can be reduced. Therefore, it is possible to realize the FeRAM having superior characteristics, and it is also possible to provide a semiconductor device high in reliability.

It is to be noted that in the capacitor of the present embodiment, not only PZT but also ferroelectric materials such as BIT(Bi$_4$Ti$_3$O$_{12}$) and SBT(SrBi$_2$Ta$_2$O$_9$) may be used. Moreover, the capacitor using the ferroelectric film of the present embodiment may be applied not only to the FeRAM but also to a DRAM, and the DRAM having fine and highly integrated superior characteristics. Therefore, it is possible to provide a highly reliable FeRAM and fine DRAM.

According to the embodiments of the present invention, there can be provided a semiconductor device in which a leak current in a capacitor using a dielectric film is reduced, and a method of manufacturing the device. That is, according to the present invention, it is possible to form a stable capacitor superior in characteristics, and it is possible to provide semiconductor devices such as an FeRAM and DRAM which are high in reliability, fine, and high in density and integration.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A semiconductor device comprising: a semiconductor substrate; and a capacitor including a lower electrode disposed above the semiconductor substrate, a dielectric film disposed above the lower electrode, and an upper electrode disposed above the dielectric film; the upper electrode including metal oxide formed of ABO$_3$ perovskite oxide and containing at least an Ru element and a Ti element as B site elements.

2. The semiconductor device according to claim 1, wherein the dielectric film contains at least Pb.

3. The semiconductor device according to claim 1, wherein metal oxide is at least one of Sr(Ru, Ti)O$_3$ and Ba(Ru, Ti)O$_3$.

4. The semiconductor device according to claim 1, wherein the capacitor includes a ferroelectric substance and has a nonvolatile memory function.

* * * * *